(12) United States Patent
Xin et al.

(10) Patent No.: US 7,890,075 B2
(45) Date of Patent: Feb. 15, 2011

(54) MECHANISM FOR CONTROLLING AMPLIFIER GAIN IN A RADIO RECEIVER

(75) Inventors: Chunyu Xin, Austin, TX (US); G. Tyson Tuttle, Austin, TX (US); Scott D. Willingham, Austin, TX (US); Peter J. Vancorenland, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 1027 days.

(21) Appl. No.: 11/648,413

(22) Filed: Dec. 29, 2006

(65) Prior Publication Data

US 2008/0160947 A1 Jul. 3, 2008

(51) Int. Cl.
*H04B 1/06* (2006.01)
(52) U.S. Cl. .............. 455/247.1; 455/234.1; 455/234.2; 455/232.1; 455/250.1; 375/345; 375/142
(58) Field of Classification Search .............. 455/247.1, 455/234.1, 232.1, 234.2, 250.1; 375/345, 375/142
See application file for complete search history.

(56) References Cited

U.S. PATENT DOCUMENTS

| 6,226,504 | B1 | 5/2001 | Takagi |
| 6,532,358 | B1 | 3/2003 | Earls |
| 6,629,932 | B2 | 10/2003 | Weber |
| 7,151,759 | B1 * | 12/2006 | Ryan et al. ................... 370/332 |
| 7,212,798 | B1 * | 5/2007 | Adams et al. ............ 455/251.1 |
| 7,421,250 | B2 * | 9/2008 | Shi ............................. 455/73 |
| 7,548,738 | B2 * | 6/2009 | Srinivasan et al. ........ 455/232.1 |
| 2003/0091132 | A1 * | 5/2003 | Anderson .................... 375/345 |
| 2008/0160945 | A1 * | 7/2008 | Crinon et al. ............ 455/234.1 |

* cited by examiner

*Primary Examiner*—Sanh D Phu
(74) *Attorney, Agent, or Firm*—Meyertons, Hood, Kivlin, Kowert & Goetzel, P.C.; Stephen J. Curran

(57) ABSTRACT

A radio receiver such as a frequency modulation (FM) receiver, for example, includes a radio frequency (RF) amplifier having an adjustable gain output. The RF amplifier may be configured to receive and amplify an incoming RF signal. The receiver also includes an intermediate frequency (IF) amplifier having an adjustable gain output. The IF amplifier may be configured to receive and amplify an IF signal that corresponds to the RF signal. The receiver also includes a gain control unit that is coupled to the RF amplifier and the IF amplifier. The gain control unit may be configured to independently adjust the gain of each of the RF amplifier and the IF amplifier, dependent upon a peak output level of both the RF amplifier and the IF amplifier.

22 Claims, 3 Drawing Sheets

MECHANISM FOR CONTROLLING AMPLIFIER GAIN IN A RADIO RECEIVER

BACKGROUND OF THE INVENTION

1. Field of the Invention

This invention relates to radio receivers and, more particularly, to automatic gain control of amplifiers within radio receivers.

2. Description of the Related Art

Radio receivers typically include a radio frequency (RF) amplifier that may amplify an incoming RF signal received from an antenna. In a wideband radio receiver such as a frequency modulation (FM) receiver, for example, the RF amplifier is typically a wideband, adjustable gain amplifier, since the RF amplifier passes all frequencies in the receiver's frequency range. The RF amplifier output may be mixed with a local oscillator signal to produce an intermediate frequency (IF) signal. In many receivers, the IF signal may be amplified by an adjustable gain amplifier, which has a narrower pass band than the RF amplifier.

One problem with conventional receivers arises when there is a strong undesired signal present. Many receivers use an automatic gain control (AGC) circuit that may attenuate very strong signals. As such, the AGC circuit may also help attenuate the undesired signal. However, since the RF amplifier is a wideband amplifier, both the desired signal and the undesired signal(s) may be present and contributing to the high signal strength. Thus, if the AGC circuit reduces the RF amplifier gain, the desired signal is also attenuated. This type of attenuation scheme may make adjustment of the IF amplifier gain difficult to optimize and may result in less receiver sensitivity. This may be especially problematic when the desired signal is a relatively weak signal.

SUMMARY

Various embodiments of a mechanism for controlling amplifier gain in a radio receiver such as a frequency modulation (FM) receiver, for example, are disclosed. In one embodiment, the radio receiver includes a radio frequency (RF) amplifier having an adjustable gain output. The RF amplifier may be configured to receive and amplify an incoming RF signal. The receiver also includes an intermediate frequency (IF) amplifier having an adjustable gain output. The IF amplifier may be configured to receive and amplify an IF signal that corresponds to the RF signal. The receiver also includes a gain control unit that is coupled to the RF amplifier and the IF amplifier. The gain control unit may be configured to independently adjust the gain of each of the RF amplifier and the IF amplifier, dependent upon a peak output level of both the RF amplifier and the IF amplifier.

Figure 1:
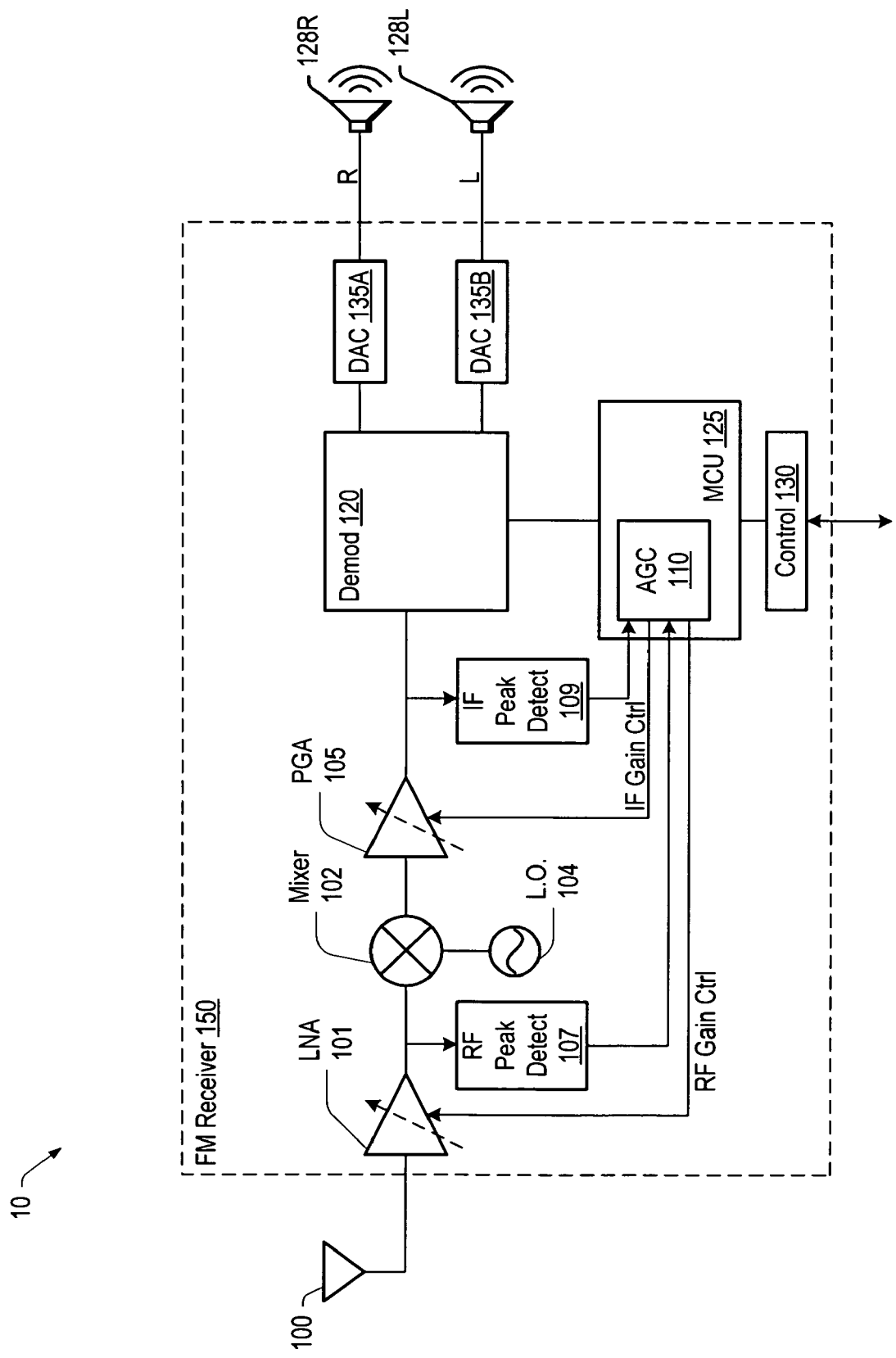
FIG. 1 is a block diagram of one embodiment of a radio system including a radio receiver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

Turning now to FIG. 1, a block diagram of one embodiment of a radio system is shown. Radio system 10 includes a frequency modulation (FM) receiver 150 that is coupled to a receiver antenna 100 and to a pair of speakers 128R and 128L. In various embodiments, FM receiver 150 may be configured to operate alone or as part of any of a variety of radio systems. For example, FM receiver 150 may be part of an FM radio, or part of a wireless communication device, such as a cellular telephone handset that includes FM reception functionality. Additionally, FM receiver 150 may be configured to operate as part of a multifunction radio system such as a car or home stereo system. As such, radio system 10 may be representative of any type of radio system that may include an FM receiver.

In the illustrated embodiment, FM receiver 150 includes a radio frequency (RF) amplifier 101, (commonly referred to as a low noise amplifier (LNA)), which is coupled to receive an RF signal from antenna 100. The output of LNA 101 is coupled to a mixer 102, which is coupled to receiver local oscillator (LO) 104. In various embodiments, mixer 102 may be implemented as an in-phase/quadrature (IQ) mixer. As such, LO 104 may be implemented with a quadrature generator (not shown) to generate the in-phase (1) and quadrature (Q) signals for mixer 102. The output of mixer 102 is coupled to and intermediate frequency (IF) amplifier 105, which is commonly referred to as a programmable gain amplifier (PGA). As above, in various embodiments, PGA 105 may be implemented as dual amplifiers to amplify the I and Q signals.

As shown in FIG. 1, the FM receiver 150 includes a demod unit 120. In one embodiment, demod unit 120 may be implemented as a digital signal processor (DSP). Demod unit 120 is coupled to a microcontroller unit designated MCU 125, which is in turn coupled to a control unit 130. In addition, demod unit 120 is coupled to digital-to-analog-converters (DAC) 135A and 135B. As shown, DAC 135A and 135B maybe coupled to stereo speakers such as speakers 128R and 128L, respectively. It is noted that FM receiver 150 may include other components that have been omitted for simplicity. It is also noted that in some embodiments only one speaker may used as desired.

As described above, FM receiver 150 may receive frequency-modulated signals at an RF frequency from antenna 100 and may provide the modulated signals at a lower frequency to the processing circuits. In one embodiment, FM receiver 150 may be configured to receive RF signals in the range of 76 MHz to 108 MHz, although other frequencies are possible and contemplated. In the illustrated embodiment, FM receiver 150 is configured to heterodyne or mix the received RF signal with the receiver LO signal, resulting in the received RF signal being down-converted to a lower frequency. In some embodiments, this lower frequency may be the baseband frequency, which is sometimes referred to as a zero-intermediate frequency (IF). Alternatively, in other embodiments, the down-converted frequency may not be at baseband, but rather at a frequency as close to zero or DC as possible, which may sometimes be referred to as a low-IF. In such embodiments, an additional mixing stage (not shown) may be used to further down convert the low-IF to the baseband frequency. It is noted that the additional mixing stage may be implemented within demod unit 120 as digital signal processing (DSP) software, or using stand-alone components, as desired.

During normal operation of FM receiver 150, LNA 101 may receive and amplify the incoming RF signal. The amplified RF signal is applied to mixer 102. LO 104 generates the LO signal for use by IQ mixer 102. Mixer 102 may be configured to mix the incoming modulated RF signal with the LO signal to produce a modulated IF signal. The modulated IF signal is amplified by PGA 105 and input into demod unit 120. In one embodiment, demod unit 120 may include analog-to-digital converters that may convert the IF signal to the digital domain for use by the remaining digital processing circuits. In one embodiment, demod unit 120 may operate on the samples for FM demodulation to recover the information in the received signal. After some additional processing, the information may then be provided to DAC 135A and 135B as stereo left and right outputs. DAC 135A and 135B may generate the analog L and R output signals that correspond to the digital outputs of demod unit 120. It is noted that demod unit 120 may be representative of any of a variety of digital signal processors. As such, demod unit 120 may include a processing engine including one or more execution units (not shown) configured to execute instructions, and one or more hardware accelerators configured to perform specific functions.

In the illustrated embodiment, MCU 125 includes an automatic gain control unit designated AGC 110. In one embodiment, MCU 125 may be configured to execute program instructions associated with application software and control functionality for FM receiver 150. In addition, control unit 130 may provide an interface for selected control functions associated with FM reception. For example, control unit 130 may provide tuning, volume, and other radio and audio function information to MCU 225.

In the illustrated embodiment, FM receiver 150 also includes an RF peak detector 107 and an IF peak detector 109 that are coupled to AGC 110. The RF and IF peak detectors may monitor the peak output of LNA 101 and PGA 105, respectively. In one embodiment, RF peak detector 107 and an IF peak detector 109 may each provide an indication that the peak output amplitude is above or below a predetermined threshold. In various implementations, the threshold may be set either by a reference voltage or by using a programmable value, for example. AGC 110 may receive the RF and IF peak indications and adjust the gain of LNA 101 and PGA 105 depending on both of the indications. It is noted that in other embodiments, the RF and IF peak detectors may monitor the peak output power of LNA 101 and PGA 105, respectively, in lieu of the peak amplitude.

As mentioned above, the presence of undesirable signals presents problems when trying to adjust the gain of the PGA in a conventional receiver. This may be especially true when, for example, the signal power of the undesirable signal is large relative to the signal of interest. Thus in some conventional receivers having only an RF peak detector, it may be difficult for the AGC circuit to optimize the gain of the PGA because the combination of the desired signal and the undesirable signal may cause the RF amplifier to distort the output signal or output too much power as seen by the RF peak detector. In this case, the AGC circuit may reduce the RF amplifier gain and the PGA gain based only on the RF peak detector output. However, as shown in FIG. 2A through FIG. 2C, due to the filtering action of both the mixer 102, PGA 105, and how far away the undesirable signal is from the desired signal, the undesirable signal may be reduced at the IF amplifier output, and thus the IF amplifier gain may be adjusted independently.

Accordingly as described further below, the combination of indications from IF peak detector 109 and RF peak detector 107 provides information that corresponds to how much of the undesired signal is left after being filtered. As such, AGC 110 may use the indications provided by both the RF peak detector 107 and the IF peak detector 109 to independently adjust the gains of LNA 101 and PGA 105.

Figure 2A:
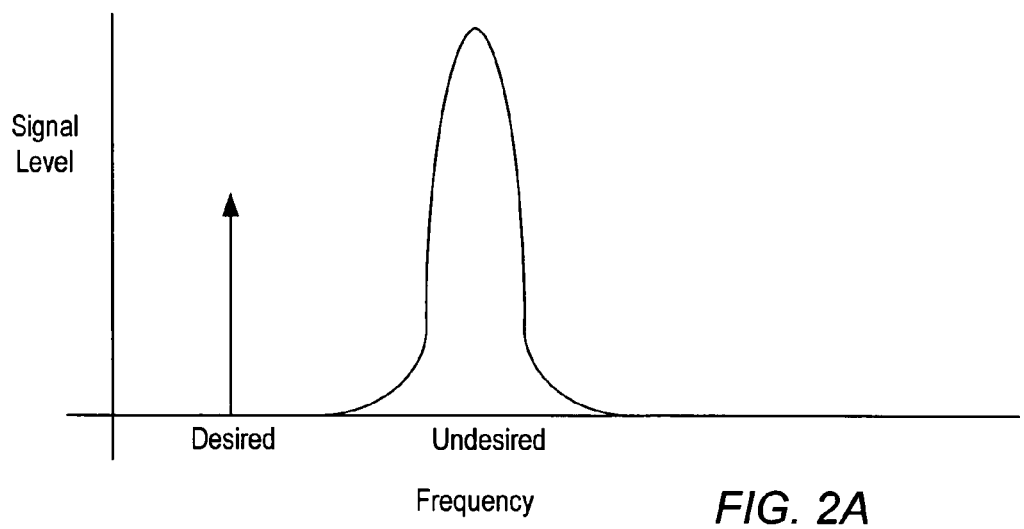
FIG. 2A is a signal level versus frequency plot illustrating an exemplary output of an embodiment of the RF amplifier of FIG. 1.
Figure 2B:
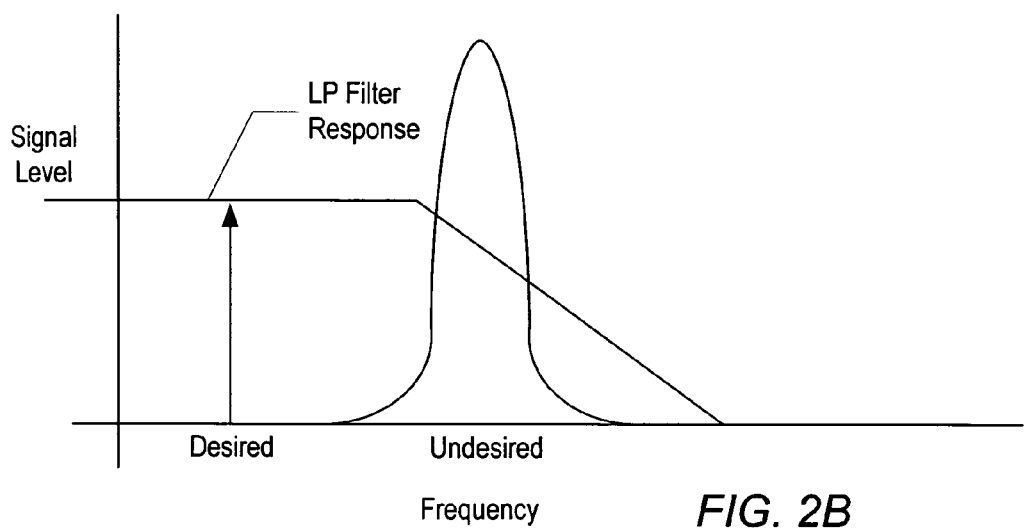
FIG. 2B is another signal level versus frequency plot illustrating the output of the RF amplifier shown in FIG. 2A with an exemplary filter transfer function plot.
Figure 2C:
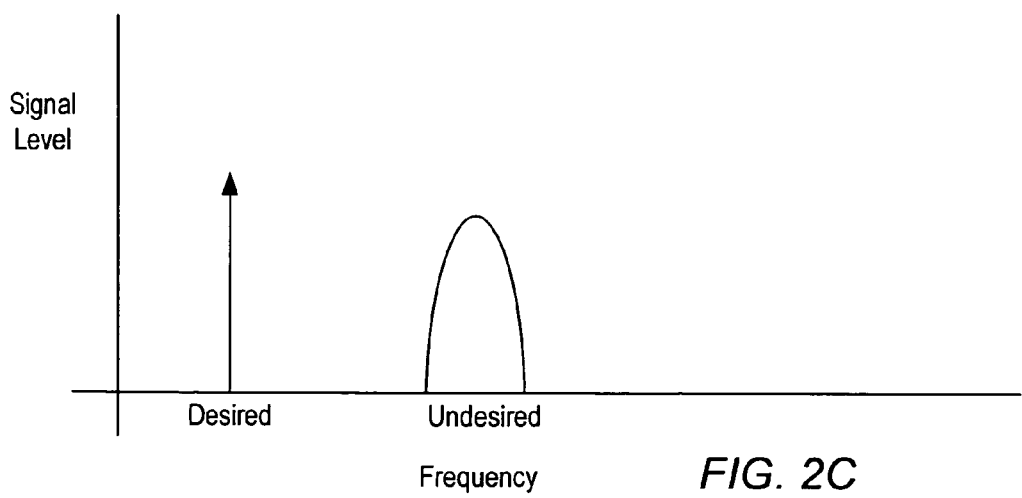
FIG. 2C is another signal level versus frequency plot illustrating an exemplary output of an embodiment the IF amplifier of FIG. 1.

FIG. 2A through FIG. 2C illustrate exemplary signal level versus frequency plots of the output of LNA 101 and PGA 105. Referring collectively now to FIG. 1 and FIG. 2A, RF peak detector 107 monitors the output of LNA 101 and provides an indication of whether the output amplitude of LNA 101 is above or below a given peak amplitude threshold. As shown in FIG. 2A, the desired signal is smaller than the undesired signal. As described above, since LNA 101 is configured to pass frequencies that cover the range of the receiver, the peak amplitude of both signals is seen at the output. It is noted that in one embodiment, the signal level shown in FIG. 2A-FIG. 2C may be representative of the amplitude of the signal, while in other embodiments, the signal level may be representative of the output power level.

However, as the output of LNA 101 is mixed with the signal form LO 104, the signal is filtered and output at a fixed IF that includes the information that was transmitted on the frequency of interest that was selected by the frequency of LO 104. The IF signal is provided to PGA 105, where it may be amplified and filtered further. In FIG. 2B an exemplary low pass filter transfer function is shown to illustrate how the undesired signal peak may be reduced while the desired signal is passed with little or no attenuation. Accordingly, an exemplary resultant plot is shown in FIG. 2C.

Figure 3:
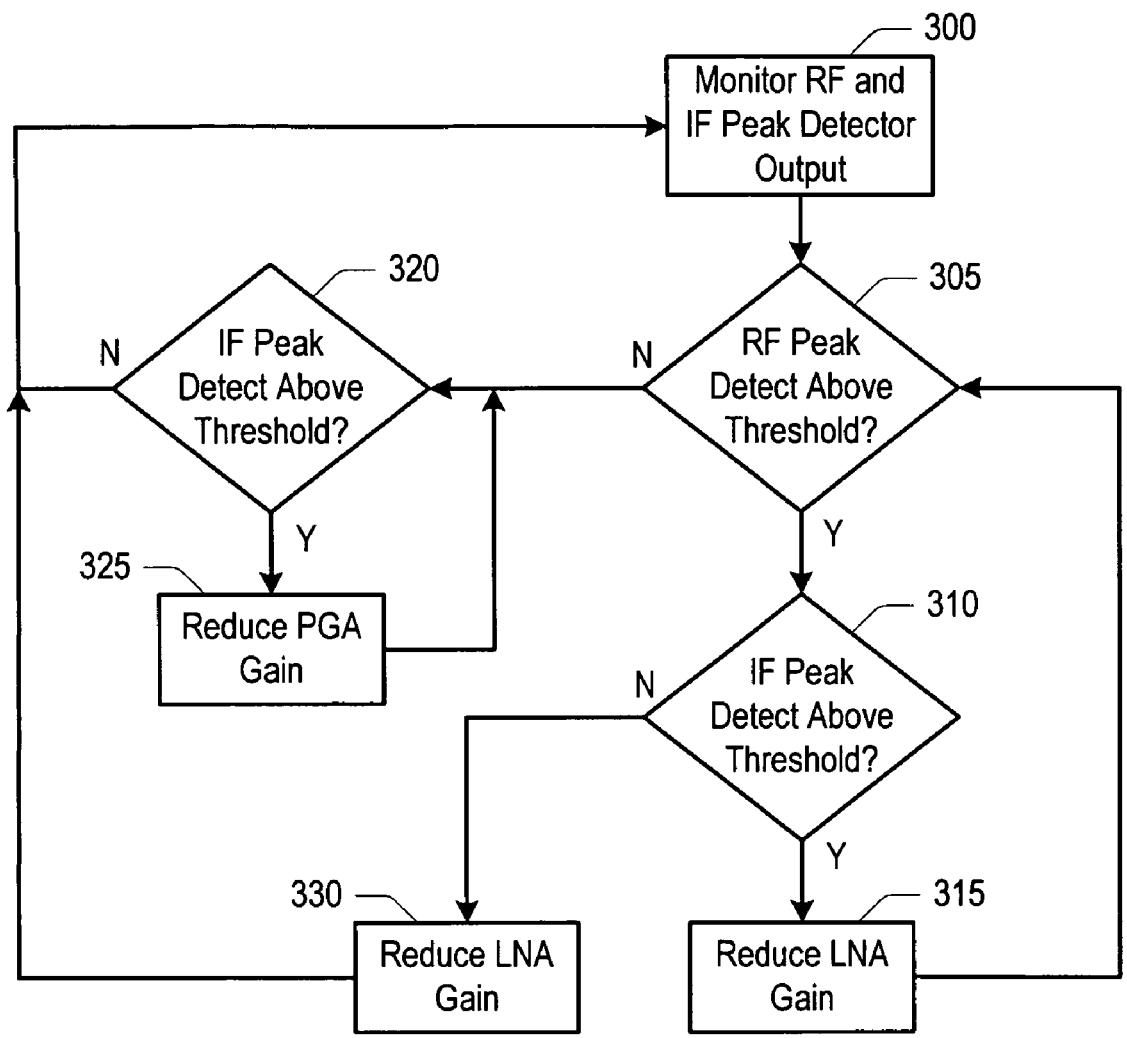
FIG. 3 is a flow diagram describing operational aspects of an embodiment of the radio receiver of FIG. 1.

As shown in the plots in FIG. 2A though FIG. 2C, the desired signal and undesired signals are affected differently by the filtering. This characteristic may be used by AGC 110 to determine which of the LNA 101 and PGA 105 gains to adjust. As such, FIG. 3 illustrates the operation of an embodiment of the receiver shown in FIG. 1 during signal reception and gain control. Since there are two peak detectors, there are four possible states in which the detector outputs may be. The first state represents neither peak detector indicating the peak amplitude is above its respective threshold. The second state represents both peak detectors indicating the peak amplitude is above their respective thresholds. The third state represents only the RF peak detector 107 indicating the peak amplitude is above its threshold. The fourth and last state represents only the IF peak detector 109 indicating the peak amplitude is above its threshold. The first state is not discussed further.

Referring collectively to FIG. 1 and FIG. 3, and beginning in block 300 of FIG. 3, AGC 110 monitors the output of RF peak detector 107 and IF peak detector 109. If AGC 110 determines the RF peak amplitude, based on the RF peak detector output indication, is above a threshold (block 305), AGC 110 determines if the IF peak amplitude, based on the IF peak detector 109 output indication, is above a threshold. If the IF peak amplitude is above the threshold (block 310) (e.g., the second state), AGC 110 may only reduce the gain of LNA 101 (block 315), but recheck for state four. Operation proceeds back to block 305 iteratively until the RF peak amplitude is not above the threshold (block 305).

Once the gain of LNA 101 has been sufficiently reduced, operation then proceeds to block 320 where AGC 110 again determines if the IF peak amplitude, based on the IF peak detector 109 output indication, is still above the threshold. If the IF peak amplitude is still above the threshold (block 320) (e.g., the fourth state), AGC 110 may reduce the gain of PGA 105 (block 325). Operation may then proceed between blocks 320 and 325 iteratively, until the IF peak amplitude is not above the threshold (block 325). Once the gain of PGA 105 has been sufficiently reduced, operation then proceeds back to block 300, where AGC 110 continues to monitor the output of RF peak detector 107 and IF peak detector 109.

Referring back to block 305, in the-event the AGC 110 determines the RF peak amplitude is above the threshold, but the IF peak amplitude is not above its threshold (block 310) (e.g., the third state), AGC 110 may only adjust LNA 101 and continue the monitoring operation as described above in the description of block 300.

It is noted that AGC 110 is shown as part of MCU 125 in the embodiments described above. However, other embodiments are contemplated in which AGC 110 may be implemented as a stand-alone unit. It is further contemplated that regardless of whether AGC 110 is part of MCU 125 or a stand-alone unit, AGC 110 may be implemented in hardware, software, or a combination as desired. It is further noted that although the radio receiver is described in the preceding embodiments as an FM receiver, it is contemplated that the radio receiver may be any type of radio receiver having an RF/IF structure similar to the structure depicted in FIG. 1.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A radio receiver comprising:
a radio frequency (RF) amplifier having an adjustable gain output, configured to receive and amplify an incoming RF signal;
an intermediate frequency (IF) amplifier having an adjustable gain output, coupled to receive an IF signal that corresponds to the RF signal, wherein the IF amplifier is configured to amplify the IF signal;
a gain control unit coupled to the RF amplifier and the IF amplifier and configured to independently adjust the gain of each of the RF amplifier and the IF amplifier, dependent upon a peak output level of both the RF amplifier and the IF amplifier.

2. The radio receiver as recited in claim 1, further comprising a mixer unit coupled between the RF amplifier and the IF amplifier and configured to generate the IF signal by mixing the RF signal with a signal provided by a local oscillator.

3. The radio receiver as recited in claim 1, further comprising an RF peak detector unit coupled to monitor the output level of the RF amplifier and configured to provide to the gain control unit, a signal indicative of whether a peak output amplitude of the RF amplifier is above a threshold.

4. The radio receiver as recited in claim 1, further comprising an IF peak detector unit coupled to monitor the output level of the IF amplifier and configured to provide to the gain control unit, a signal indicative of whether a peak output amplitude of the IF amplifier is above a threshold.

5. The radio receiver as recited in claim 1, wherein the gain control unit is further configured to determine whether to adjust the gain of: only the RF amplifier, only the IF amplifier, or both the RF amplifier and the IF amplifier, dependent upon the peak output amplitude of both the RF amplifier and the IF amplifier.

6. The radio receiver as recited in claim 5, wherein the gain control unit is configured to reduce the gain of only the RF amplifier in response to the RF amplifier peak output amplitude being above a first predetermined threshold and the IF amplifier peak output amplitude being above a second predetermined threshold.

7. The radio receiver as recited in claim 6, wherein the gain control unit is configured to reduce the gain of only the IF amplifier in response to the IF amplifier peak output amplitude remaining above the second predetermined threshold after the gain of the RF amplifier has been reduced and the RF amplifier peak output amplitude is below the first predetermined threshold.

8. The radio receiver as recited in claim 7, wherein the gain control unit is configured to reduce the gain of only the IF amplifier until the IF peak output amplitude is at or below the second predetermined threshold.

9. The radio receiver as recited in claim 5, wherein the gain control unit is configured to reduce the gain of only the RF amplifier in response to the RF amplifier peak output amplitude being above a first predetermined threshold and the IF amplifier peak output amplitude being below a second predetermined threshold.

10. The radio receiver as recited in claim 1, wherein the peak output level of both the RF amplifier and the IF amplifier corresponds to a peak output power, and wherein the gain control unit is further configured to determine whether to adjust the gain of: only the RF amplifier, only the IF amplifier, or both the RF amplifier and the IF amplifier, dependent upon the peak output power level of both the RF amplifier and the IF amplifier.

11. A method comprising:
a radio frequency (RF) amplifier having an adjustable gain output, receiving and amplifying an incoming RF signal;
an intermediate frequency (IF) amplifier having an adjustable gain output, receiving and amplifying an IF signal that corresponds to the RF signal;
independently adjusting the gain of each of the RF amplifier and the IF amplifier, dependent upon a peak output level of both the RF amplifier and the IF amplifier.

12. The method as recited in claim 11, further comprising monitoring an RF peak output level the RF amplifier and providing a signal indicative of whether a peak output amplitude of the RF amplifier is above a threshold.

13. The method as recited in claim 11, further comprising monitoring an IF peak output level of the IF amplifier and providing a signal indicative of whether a peak output amplitude of the IF amplifier is above a threshold.

14. The method as recited in claim 11, further comprising determining whether to adjust the gain of only the RF amplifier, only the IF amplifier or both the RF amplifier and the IF amplifier dependent upon the peak output amplitude of both the RF amplifier and the IF amplifier.

15. The method as recited in claim 14, further comprising reducing the gain of only the RF amplifier in response to the RF amplifier peak output amplitude being above a first predetermined threshold and the IF amplifier peak output amplitude being above a second predetermined threshold.

16. The method as recited in claim 15, further comprising reducing the gain of only the IF amplifier in response to the IF amplifier peak output amplitude remaining above the second predetermined threshold after reducing the gain of the RF amplifier and the RF amplifier peak output amplitude being below the first predetermined threshold.

17. The method as recited in claim 16, further comprising reducing the gain of only the IF amplifier includes reducing the gain until the IF peak output amplitude is at or below the second predetermined threshold.

18. The method as recited in claim 14, further comprising reducing the gain of only the RF amplifier in response to the RF amplifier peak output amplitude being above a first predetermined threshold and the IF amplifier peak output amplitude being below a second predetermined threshold.

19. The method as recited in claim 11, further comprising determining whether to adjust the gain of: only the RF amplifier, only the IF amplifier, or both the RF amplifier and the IF amplifier, dependent upon the peak output power level of both the RF amplifier and the IF amplifier.

20. A frequency modulation (FM) receiver comprising:
   a radio frequency (RF) amplifier having an adjustable gain output, configured to receive and amplify an incoming RF signal;
   an intermediate frequency (IF) amplifier having an adjustable gain output, coupled to receive an IF signal that corresponds to the RF signal, wherein the IF amplifier is configured to amplify the IF signal;
   a gain control unit coupled to the RF amplifier and the IF amplifier and configured to determine whether to adjust the gain of the RF amplifier, the IF amplifier, or both, dependent upon a peak output level of both the RF amplifier and the IF amplifier.

21. The FM receiver as recited in claim 20, further comprising:
   an RF peak detector unit configured to monitor an RF peak output level the RF amplifier and to provide a signal to the gain control unit, indicative of whether a peak output amplitude of the RF amplifier is above a threshold;
   an IF peak detector unit coupled to monitor an IF peak power output the IF amplifier and configured to provide a signal to the gain control unit, indicative of whether a peak output amplitude of the IF amplifier is above a threshold.

22. The FM receiver as recited in claim 20, wherein the gain control unit is configured to:
   reduce the gain of only the RF amplifier in response to the RF amplifier peak output amplitude being above a first predetermined threshold and the IF amplifier peak output amplitude being above a second predetermined threshold.
   reduce the gain of only the IF amplifier in response to the IF amplifier peak output amplitude remaining above the second predetermined threshold after the gain of the RF amplifier has been reduced and the RF amplifier peak output amplitude is below the first predetermined threshold.

* * * * *